United States Patent
Krämer et al.

(10) Patent No.: US 7,772,158 B2
(45) Date of Patent: Aug. 10, 2010

(54) DEVICE FOR RESISTIVELY LIMITING CURRENT, COMPRISING A STRIP-SHAPED HIGH-TO-SUPER CONDUCTOR PATH

(75) Inventors: Hans-Peter Krämer, Erlangen (DE); Wolfgang Schmidt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 613 days.

(21) Appl. No.: 11/664,593

(22) PCT Filed: Sep. 27, 2005

(86) PCT No.: PCT/EP2005/054855

§ 371 (c)(1),
(2), (4) Date: Apr. 4, 2007

(87) PCT Pub. No.: WO2006/037742

PCT Pub. Date: Apr. 13, 2006

(65) Prior Publication Data

US 2008/0108506 A1    May 8, 2008

(30) Foreign Application Priority Data

Oct. 4, 2004 (DE) .................... 10 2004 048 644

(51) Int. Cl.
*H01L 39/24* (2006.01)

(52) U.S. Cl. .............. 505/237; 505/236; 505/238; 505/780

(58) Field of Classification Search ............... 505/236, 505/237, 238
See application file for complete search history.

(56) References Cited

U.S. PATENT DOCUMENTS

| 4,921,833 | A | 5/1990 | Takano |
| 5,180,707 | A * | 1/1993 | Gao et al. ............ 505/471 |
| 5,828,291 | A | 10/1998 | Baumann et al. |
| 6,522,236 | B1 | 2/2003 | Ries |
| 6,552,415 | B1 | 4/2003 | Paul et al. |
| 2004/0266628 | A1 * | 12/2004 | Lee et al. ............ 505/238 |

FOREIGN PATENT DOCUMENTS

| DE | 44 34 819 | 1/1996 |
| DE | 199 09 266 | 9/2000 |
| DE | 102 26 391 | 1/2004 |
| EP | 0 2925 959 | 3/1994 |
| WO | 99 33122 | 7/1999 |

* cited by examiner

Primary Examiner—Stanley Silverman
Assistant Examiner—Paul A Wartalowicz
(74) Attorney, Agent, or Firm—Staas & Halsey LLP

(57) ABSTRACT

The resistive current-limiting device contains a strip-shaped superconductor having a conductive structure which is made of a metallic substrate strip, an insulating, oxidic buffer layer, a super-conductive layer made of a type AB2Cu3Ox oxidically high-$T_c$-super conductive material, an insulating buffer layer which is arranged therebetween, and a metal cover layer. At least one of the lateral edges of the conductive structure is mechanically deformed such that the cover layer and the substrate strip are arranged in electric contact.

7 Claims, 1 Drawing Sheet

DEVICE FOR RESISTIVELY LIMITING CURRENT, COMPRISING A STRIP-SHAPED HIGH-TO-SUPER CONDUCTOR PATH

CROSS REFERENCE TO RELATED APPLICATIONS

This application is based on and hereby claims priority to PCT Application No. PCT/EP2005/054855 filed on Sep. 27, 2005 and German Application No. 10 2004 048 644.1 filed on Oct. 4, 2004, the contents of which are hereby incorporated by reference.

BACKGROUND OF THE INVENTION

The invention relates to a resistive superconducting current limiter device comprising a conductor track composed of a strip-type superconductor, the conductor construction of which contains at least a substrate strip composed of a normally conducting substrate metal, a superconducting layer composed of an oxidic high-$T_c$ superconductor material of the $AB_2CU_3O_x$ type where A denotes at least one rare earth metal including yttrium and B denotes at least one alkaline earth metal, a buffer layer arranged in between, the buffer layer being composed of an insulating, oxidic buffer material, and also a cover layer applied on the superconducting layer, the cover layer being composed of a normally conducting cover layer material. A corresponding current limiter device is evident from DE 199 09 266 A1.

Superconducting metal oxide compounds having high critical temperatures $T_c$ of above 77 k have been known since 1986, and they are therefore also referred to as high-$T_c$ superconductor materials or HTS materials and are in particular a liquid nitrogen ($LN_2$) cooling technique. Such metal oxide compounds include in particular cuprates based on special material systems such as, for example, of the type $AB_2Cu_3O_x$, where A is at least one rare earth metal including yttrium and B is at least one alkaline earth metal. The main representative of the material system of the so-called 1-2-3-HTS type is the so-called YBCO ($Y_1Ba_2Cu_3O_x$ where $6.5 \leq x \leq 7$).

It is attempted to deposit the known HTS material on different substrates for various application purposes, superconductor material with the maximum possible phase purity generally being sought. Thus, in particular metallic substrates are provided for conductor applications (cf. e.g. EP 0 292 959 A1).

In a corresponding conductor construction, the HTS material is generally not deposited directly on a carrier strip serving as a substrate; rather, this substrate strip is firstly covered with at least one thin interlayer, which is also referred to as a buffer layer. This buffer layer, with a thickness of the order of magnitude of 1 μm, is intended on the one hand to prevent the diffusion of metal atoms from the substrate into the HTS material, which metal atoms could impair the superconducting properties. On the other hand, the buffer layer is intended to enable a textured formation of the HTS material. Corresponding buffer layers generally comprise oxides of metals such as zirconium, cerium, yttrium, aluminum, strontium or magnesium or mixed crystals comprising a plurality of the metals and are therefore electrically insulating. In a corresponding current-conducting conductor track, this results in problems as soon as the superconducting material undergoes transition to the normally conducting state (so-called "quenching"). In this case, the superconductor initially becomes resistive in sections and thus assumes a resistance R, for example by virtue of the fact that it is heated above the critical temperature $T_c$ of its superconductor material (so-called "hot spots" or partial quenching regions) and is usually heated further, with the result that the layer can burn out.

On account of these problems, it is known to apply directly on the HTS conduction layer an additional metallic cover layer composed of a material that is compatible with the HTS material and has good electrical conductivity, such as Au or Ag, as a shunt against a burn-out. The HTS material is therefore in an electrically conductive, areal contact with the metallic cover layer (cf. DE 44 34 819 C).

Owing to the hot spots or partial quenching regions that are also present with shunts, the voltage is distributed nonuniformly along the superconductor layer. In the substrate strip carrying the superconducting layer, by contrast, the voltage U applied to the ends is dropped uniformly over the entire length or it is at an undefined intermediate potential if the ends are insulated from the applied voltage. Under certain circumstances, this may result in voltage differences in the conductor track across the buffer layer with respect to the substrate. Owing to the small thickness of this layer, this inevitably leads to electrical breakdowns and thus to the buffer layer, and possibly the superconducting layer, being destroyed at certain points. Voltages of the order of magnitude of 20 to 100 volts for buffer layer thicknesses of 1 μm typically suffice for a breakdown. A corresponding problem arises in particular when the intention is to create resistive current limiter devices with corresponding conductor strips. This is because in such a device the transition from the superconducting state to the normally conducting state is utilized to limit current in the event of a short circuit. In this case it is not readily possible to provide the buffer layer with a sufficient dielectric strength to withstand the operating voltages in the kV range which are customary for such devices.

A strip-type superconductor having a corresponding construction is used in the current limiter device that can be gathered from the DE-A1 document cited in the introduction. In the case of this construction, there is the risk discussed of electrical breakdowns across the buffer layer.

SUMMARY

It is one possible object of the present invention, in the case of a resistive superconducting current limiter device having the features mentioned in the introduction, is to preclude the risk of an electrical breakdown during quenching in the current limiting case.

In the case of the current limiter device having the features mentioned in the introduction, at least in partial regions, the inventors propose at least one of the lateral edges of the conductor construction is mechanically deformed in such a way that the cover layer and the substrate strip are in electrical contact.

The advantages associated with this embodiment of the current limiter device can be seen in particular in the fact that the metallic substrate strip and the normally conducting cover layer and thus also the superconducting layer directly electrically connected thereto, as seen in the current-carrying direction, are brought into electrical contact with one another at least in the partial regions along the length of the construction and are therefore at a single electrical potential even in the case of quenching. A breakdown across the buffer layer is prevented in this way. A corresponding deformation at at least one of the longitudinal sides of the conductor construction is tenable insofar as normally the superconducting properties of the superconducting layer are impaired at the lateral edges in any case owing to production.

In the case of the current limiter device proposed, in particular the following measures are also additionally provided individually or else in combination:

thus, the electrical contact at the at least one lateral edge may be formed by a crimping or rolling deformation. Corresponding deformations are easy to implement.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
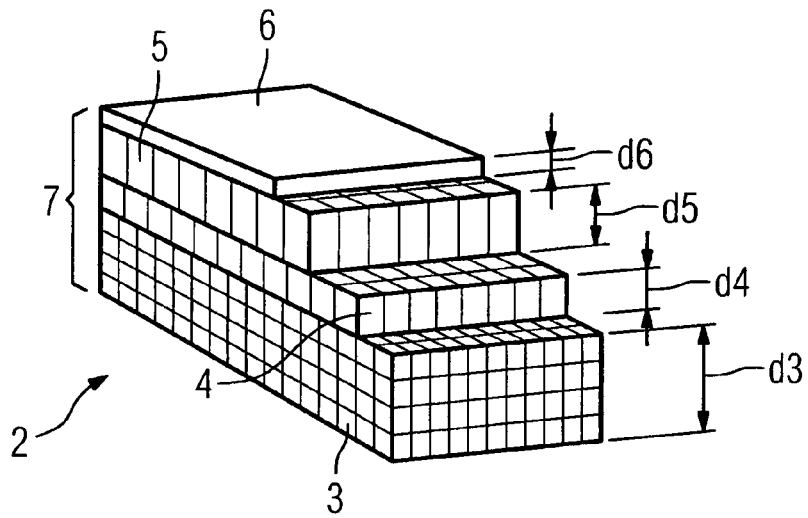
FIG. 1 shows the construction of a YBCO strip conductor of the current limiter device in oblique plan view.

Reference will now be made in detail to the preferred embodiments of the present invention, examples of which are illustrated in the accompanying drawings, wherein like reference numerals refer to like elements throughout.

In this case, mutually corresponding parts are in each case provided with the same reference symbols in the figures.

The strip conductor which is indicated in FIG. 1 and is designated generally by 2 proceeds from embodiments of so-called YBCO strip conductors or "YBCO Coated Conductors" that are known per se. In the figure:

3 designates a substrate strip composed of a normally conducting substrate metal having the thickness d3, 4 designates at least one buffer layer applied thereon and composed of an insulating, oxidic buffer material having the thickness d4, 5 designates an HTS layer comprised of YBCO having the thickness d5, 6 designates a cover layer composed of a normally conducting cover metal having the thickness D6 as a protection and/or contact layer, and 7 designates the conductor construction comprising these four parts.

In this case, the parts can be formed as follows:

a metallic substrate strip 3 composed of Ni, Ni alloys or high-grade steel having a thickness d3 of approximately 50 to 250 µm, at least one buffer layer or a buffer layer system composed of one or more layers of oxides such as $CeO_2$ or YSZ having a thickness d4 of approximately 0.1 to 1.5 µm; that is to say that the buffer layer may in this case, in a manner known per se, also be composed as a system of a plurality of layers of different oxidic material at least one HTS layer 5 composed of YBCO having a thickness d5 of between approximately 0.3 and 3 µm, and at least one metallic cover layer 6 composed of Ag, Au or Cu having a thickness d6 of between approximately 0.1 µm and 1 mm. In this case, the cover layer may also be composed of a plurality of layers of metallic material, if appropriate different metals.

a corresponding strip conductor has a width of a few millimeters to a few centimeters. Its superconducting current capability is determined by the YBCO layer 5, that is to say by the critical current density thereof, while the thermal, mechanical and normally conducting properties are dominated by the substrate strip 3 owing to the larger thickness $d3=d_s$. In this case, the substrate strip together with the buffer layer forms a support for a quasi monocrystalline growth of the YBCO. Substrate strip material and buffer layer material must not deviate too far from YBCO in terms of the coefficient of thermal expansion and in terms of their crystallographic lattice constants. The better the matching, the higher the crack-free layer thickness and the better the crystallinity of the YBCO. What is more, an as far as possible parallel orientation of the crystal axes in adjacent crystallites is desired for high critical current densities in the $MA/cm^2$ range. This requires precisely such an orientation at least in the topmost buffer layer in order that the YBCO can grow heteroepitaxially. Such quasi monocrystalline flexible substrate-buffer systems are preferably prepared by three methods:

so-called "Ion Beam Assisted Deposition (IBAD)" of usually YSZ or MgO on untextured metal strips, so-called "Inclined Substrate Deposition (ISD)" of YSZ or MgO on untextured metal strips, so-called "Rolling Assisted Biaxially Textured Substrates (RABiTS)" i.e. substrates with a heteroepitaxial buffer system brought to cube situation by rolling and thermal treatment.

The functional layers 4 to 6 that are to be deposited on the substrate strip are produced in a manner known per se by vacuum coating methods (PVD), chemical vapor deposition (CVD) or chemical solution deposition (CSD).

It goes without saying that between the individual layers of the construction 7 there may also be comparatively thinner interlayers that form during the production of the construction or the deposition of the individual layers in particular as a result of diffusion and/or reaction processes.

In comparison with the ceramic plate conductors known for YBCO thin-film current limiters, in the case of strip conductors of the type outlined above, the substrate strip 3 is electrically conductive, that is to say that it can carry the limited current and act as a shunt. With the conductor construction 7 shown in the figure, however, the HTS layer 5 and the substrate strip 3 would be insulated from one another. As soon as the current limiting device undergoes transition to its limiting state, that is to say becomes normally conducting, and a voltage builds up along the conductor track, the breakdown field strengths of the known buffer layer materials, which are of the order of magnitude of 100 kV/mm=10 V/0.1 µm, is rapidly exceeded. That is to say that the buffer layer 4 would then break down in uncontrolled fashion. Therefore, with the proposed device, a good electrical contact between the superconducting layer 5 and the metallic substrate strip 3 preferably over the entire conductor length is advantageous for the use of strip conductors in current limiters.

Figure 2:
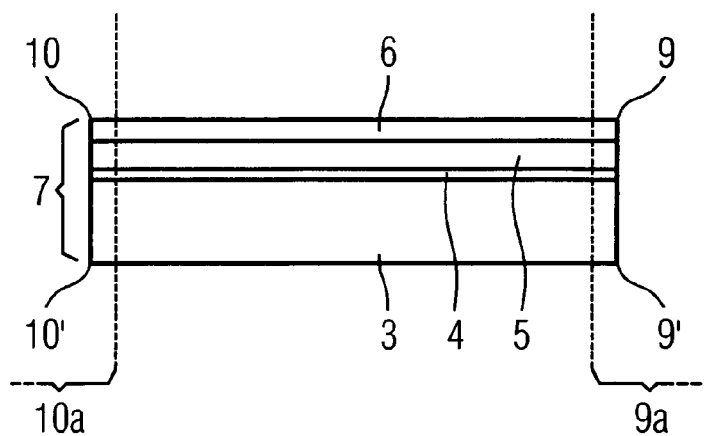
FIG. 2 shows the strip conductor in cross-sectional view prior to an edge deformation and FIG. 3 shows the strip conductor in cross-sectional view after such a deformation.
Figure 3:
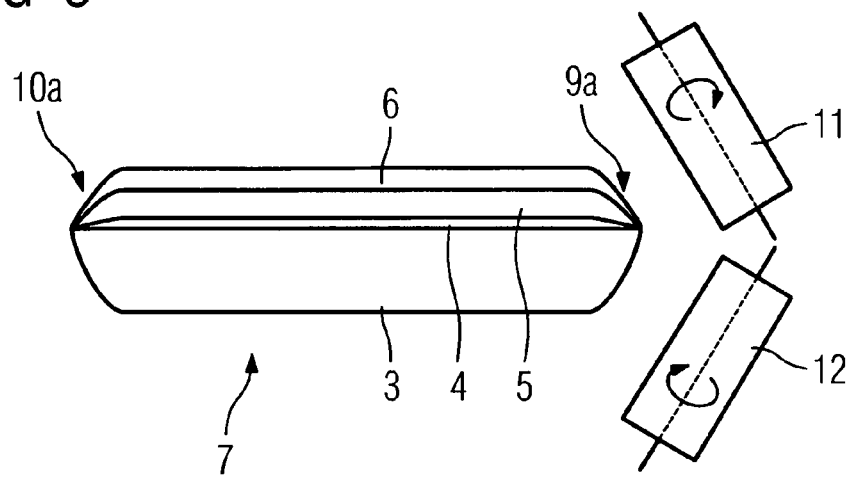

A corresponding continuous contact-connection over the entire length can be seen from the embodiment according to FIGS. 2 and 3. In this case, FIG. 2 shows the conductor construction 7 prior to a deformation treatment in lateral regions 9a and 9b. A deformation in these regions is generally unproblematic because the superconducting properties of the superconducting layer 5 are often impaired there compared with the central region of the conductor.

In accordance with FIG. 3, the desired deformation can be performed for example with the aid of edge rollers 11 and 12. In this case, the rollers act on the respective lateral edges 9, 9' and/or 10, 10' in such a way that the construction is compressed from there approximately in a diagonal direction. In this case, the cover layer material is pressed onto the mechanically more robust substrate strip, with the result that a direct electrical connection between the metallic material of the cover layer 6 and the metallic material of the substrate strip 3 is produced at least in partial regions of the longitudinal side of the conductor strip.

In the exemplary embodiments above, YBCO is taken as a basis as the HTS material for the superconducting layer 5. It goes without saying that it is also possible to use other HTS materials of the so-called 1-2-3 type with other rare earth metals and/or other alkaline earth metals. Individual components of the materials can also be substituted in part by further components in a manner known per se.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A resistive superconducting current limiter device having a strip-like conductor track, the conductor track comprising:
    a substrate strip formed of a normally conducting substrate metal;
    a superconducting layer formed of an oxidic high-$T_c$ superconductor material of $AB_2CU_3O_x$ where A denotes at least one element selected from the group consisting of rare earth metals and yttrium, and B denotes at least one alkaline earth metal;
    a buffer layer arranged between the substrate strip and the superconducting layer, the buffer layer being formed of an insulating, oxidic buffer material; and
    a cover layer formed on the superconducting layer, the cover layer being formed of a normally conducting cover layer material; and
    at least one electrical contact formed at one or more lateral edges of the conductor track, each of the substrate strip, the superconducting layer, the buffer layer, and the cover layer thinning in a direction of the lateral edges such that the at least one electrical contact is formed at a position in which the cover layer and the substrate strip contact each other.

2. The current limiter device as claimed in claim 1, wherein the position in which the cover layer and the substrate strip contact each other is formed by a crimping or rolling deformation.

3. The current limiter device as claimed in claim 1, wherein the cover layer is formed of a plurality of layers of metallic material.

4. The current limiter device as claimed in claim 1, wherein the buffer layer is formed of a plurality of layers of oxidic material.

5. The current limiter device as claimed in claim 2, wherein the cover layer is formed of a plurality of layers of metallic material.

6. The current limiter device as claimed in claim 5, wherein the buffer layer is formed of a plurality of layers of oxidic material.

7. A method of forming resistive superconducting current limiter device having a strip-like conductor track, the conductor track being formed by a process comprising:
    forming a substrate strip of a normally conducting substrate metal;
    forming a buffer layer on the substrate strip, the buffer layer being formed of an insulating, oxidic buffer material;
    forming a superconducting layer on the buffer layer, the superconducting layer being formed of an oxidic high-$T_c$ superconductor material of $AB_2CU_3O_x$ where A denotes at least one element selected from the group consisting of rare earth metals and yttrium, and B denotes at least one alkaline earth metal;
    forming a cover layer on the superconducting layer, the cover layer being formed of a normally conducting cover layer material; and
    using crimping or rolling deformation to deform at least one lateral edge region of the conductor track such that each of the substrate strip, the superconducting layer, the buffer layer, and the cover layer are thinned in a direction of the at least one lateral edge and the cover layer and the substrate strip make direct electrical contact in the at least one lateral edge region.

* * * * *